United States Patent [19]
Moore et al.

[11] Patent Number: 5,930,642
[45] Date of Patent: Jul. 27, 1999

[54] TRANSISTOR WITH BURIED INSULATIVE LAYER BENEATH THE CHANNEL REGION

[75] Inventors: Bradley T. Moore; Robert Dawson; H. Jim Fulford, Jr., all of Austin; Mark I. Gardner, Cedar Creek; Frederick N. Hause, Austin; Mark W. Michael, Cedar Park; Derick J. Wristers, Austin, all of Tex.

[73] Assignee: Advanced Micro Devices, Inc., Sunnyvale, Calif.

[21] Appl. No.: 08/871,468

[22] Filed: Jun. 9, 1997

[51] Int. Cl.⁶ ............................ H01L 21/265; H01L 29/24
[52] U.S. Cl. ........................ 438/407; 438/527; 438/766; 257/347
[58] Field of Search ............................ 438/297, 407, 438/423, 328, 766

[56] References Cited

U.S. PATENT DOCUMENTS

| | | | |
|---|---|---|---|
| 4,523,963 | 6/1985 | Ohta et al. | 148/1.5 |
| 4,683,637 | 8/1987 | Varker et al. | 438/423 |
| 4,948,624 | 8/1990 | Rivaud et al. | 427/38 |
| 5,077,225 | 12/1991 | Lee | 437/24 |
| 5,116,771 | 5/1992 | Karulkar | 438/766 |
| 5,290,720 | 3/1994 | Chen | 257/328 |
| 5,364,800 | 11/1994 | Joyner | 438/766 |
| 5,396,087 | 3/1995 | Baliga | 257/139 |
| 5,436,175 | 7/1995 | Nakato et al. | 437/24 |
| 5,510,640 | 4/1996 | Shindo | 257/347 |

OTHER PUBLICATIONS

Silicon Processing for the VLSI Era—vol. 2: Process Integration, by S. Wolf, published by Lattice Press, Sunset Beach, CA, 1987, pp. 72–75.

*Primary Examiner*—Olik Chaudhuri
*Assistant Examiner*—William David Coleman
*Attorney, Agent, or Firm*—Skjerven, Morrill, MacPherson, Franklin & Friel, L.L.P.; William W. Holloway

[57] ABSTRACT

A transistor with a buried insulative layer beneath a channel region is disclosed. Unlike conventional SIMOX, the buried insulative layer has a top surface beneath the channel region that is closer than bottom surfaces of the source and drain to the top surface of the substrate. Preferably, the buried insulative layer is formed by implanting oxygen into the substrate and then performing a high-temperature anneal so that the implanted oxygen reacts with silicon in the substrate to form a continuous stoichiometric layer of silicon dioxide. Advantageously, the buried insulative layer provides a diffusion barrier and an electrical isolation barrier for the channel region.

20 Claims, 5 Drawing Sheets

TRANSISTOR WITH BURIED INSULATIVE LAYER BENEATH THE CHANNEL REGION

BACKGROUND OF THE INVENTION

1. Field of the Invention

The present invention relates to integrated circuits, and more particularly to insulated-gate field-effect transistors.

2. Description of Related Art

An insulated-gate field-effect transistor (IGFET), such as a metal-oxide semiconductor field-effect transistor (MOSFET), uses a gate electrode to control a channel region between a source and drain. The channel region, source and drain are located in a semiconductor substrate, with the source and drain being doped oppositely to the channel region and the substrate. The gate electrode is separated from the semiconductor substrate by a thin insulating layer such as a gate oxide. The operation of the IGFET involves application of an input voltage to the gate electrode, which sets up a transverse electric field in order to modulate the longitudinal conductance of the channel.

Polysilicon (also called polycrystalline silicon, poly-Si or poly) thin films have many important uses in IGFET technology. One of the key innovations is the use of heavily doped polysilicon as the gate electrode in place of aluminum. Since polysilicon has the same high melting point as a silicon substrate, it can be deposited prior to source and drain formation, and serve as a mask during formation of the source and drain by ion implantation. Thereafter, the implanted dopant is activated using a high-temperature anneal that would otherwise melt the aluminum. This self-aligning procedure tends to improve packing density and reduce parasitic overlap capacitances between the gate electrode and the source and drain. The resistance of polysilicon can be further reduced by forming a silicide on its top surface.

As IGFET dimensions are reduced, the maximum lateral electric field in the channel region near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate electrode, and a heavy implant is self-aligned to the gate electrode on which sidewall spacers have been formed. The spacers are typically oxides or nitrides. The purpose of the lighter first dose is to form a lightly doped region of the drain (or LDD) at the edge near the channel region. The second heavier dose forms a low resistivity region of the drain, which is subsequently merged with the lightly doped region. Since the heavily doped region is farther away from the channel region than a conventional drain structure, the depth of the heavily doped region can be made somewhat greater without adversely affecting the device characteristics. A lightly doped region is not necessary for the source (unless bidirectional current is used), however lightly doped regions are typically formed for both the source and drain to avoid the need for an additional masking step.

Junction isolation typically refers to devices that are isolated by an oxide along the sidewalls and by a PN junction at the bottom. Junction isolation, however, is often not suitable for high-voltage applications and high-radiation environments. Silicon-on-insulator (SOI) refers to a group of technologies that provide a uniform insulating layer beneath a semiconducting layer, so that devices can be isolated by completely surrounding them with an insulator. SOI also reduces parasitic capacitance between adjacent devices.

Furthermore, as gate oxide thickness is reduced, the doping levels in the channel regions must be increased in order to maintain proper threshold voltages. Transistors with too low a threshold voltage do not turn off properly and may sustain a significant leakage current even with zero volts applied to the gate electrode. This leakage places a lower limit on the threshold voltage reductions which may be made as operating voltages are reduced to 2.7 volts or 1.8 volts. As the difference between the threshold voltage and the operating voltage is reduced, drive currents are also reduced. Another advantage of SOI is that it limits the depletion depth of the channel region, thereby improving the drive current for a given operating voltage.

SIMOX (Separation by IMplanted OXygen) is a form of SOI. SIMOX includes implanting oxygen into a silicon substrate, and then heating the substrate so that implanted oxygen and silicon react to form a buried layer of silicon dioxide. SIMOX typically involves a high dose (e.g., $2 \times 10^{18}$ atoms/cm$^2$) of atomic oxygen ions (O+) implanted at a very high energy (e.g., 150 to 180 kiloelectron-volts) so that the peak of the oxygen implant is sufficiently deep within the silicon substrate. Special oxygen implanters have been marketed, for instance, by Eaton Corp. under model numbers NV-10 and Nova-100. The silicon substrate is normally heated to at least 400° C. during the high-dose implantation step to reduce disruptions to surface crystallinity. After implantation occurs, typically a high-temperature anneal (e.g., 1100 to 1175° C.) is performed in a neutral ambient (e.g., $N_2$) for a considerable length of time (e.g., 3 to 5 hours). As a result, the implanted oxygen and the silicon substrate react to form a continuous layer of stoichiometric silicon dioxide that is buried in the substrate. The buried oxide layer typically has a maximum thickness of 5000 angstroms and is buried 1000 to 3000 angstroms beneath the top of the substrate. Typically an additional layer of epitaxial silicon is deposited on the substrate so that single-crystal device regions at least 5000 angstroms thick are available for device fabrication. See, for instance, SILICON PROCESSING FOR THE VLSI ERA, Volume 2: Process Integration, by S. Wolf, published by Lattice Press, Sunset Beach, Calif., pp. 72–75 (1990), which is incorporated herein by reference.

SIMOX offers other advantages. For instance, SIMOX can reduce diffusion of channel dopants into the underlying substrate and vice-versa. SIMOX can also reduce undesired deep channel currents between the source and drain. In addition, SIMOX can reduce depletion capacitance since silicon dioxide has a smaller dielectric coefficient than silicon. These advantages are typically enhanced as the SIMOX beneath the channel region gets closer to the top surface of the substrate. However, in conventional practice, SIMOX is formed uniformly across the entire semiconductor substrate prior to device fabrication. As a result, conventional SIMOX beneath the channel region is incapable of getting closer than the bottom surfaces of the source and drain to the top surface of the substrate. Needless to say, it would be desirable to provide an IGFET with a buried insulative layer that overcomes these limitations.

SUMMARY OF THE INVENTION

The present invention provides a transistor with a buried insulative layer beneath a channel region. Unlike conventional SIMOX the buried insulative layer has a top surface beneath the channel region that is closer than the bottom surfaces of the source and drain to the top surface of the substrate. Suitable buried insulative layers include silicon dioxide, silicon nitride, and silicon oxynitride. Preferably, the buried insulative layer is formed by implanting oxygen into the substrate and then performing a high-temperature anneal so that the implanted oxygen reacts with silicon in the substrate to form a continuous stoichiometric layer of silicon dioxide.

In a first embodiment, the oxygen is implanted into the active region using an implant mask before the gate electrode is formed so that the buried oxide layer is beneath the entire channel region but only portions of the source/drain regions. In a second embodiment, the oxygen is implanted into the active region after the gate electrode is formed so that a central portion of the buried oxide layer beneath the gate electrode is closer to the top surface of the substrate than are outer portions of the buried oxide layer beneath the source/drain regions.

Advantageously, the top surface of the buried oxide layer beneath the channel region is closer to the top surface of the substrate than is the case with conventional SIMOX thereby providing an improved diffusion barrier and/or electrical isolation barrier for the channel region.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

In the drawings, depicted elements are not necessarily drawn to scale and like or similar elements may be designated by the same reference numeral throughout the several views.

FIGS. 1A–1K show cross-sectional views of successive process steps for forming an IGFET with a buried oxide layer in accordance with a first embodiment of the invention. In the first embodiment, the oxygen is implanted into the substrate using an implant mask before the gate electrode is formed. As a result, the buried oxide layer has a relatively uniform depth and extends beneath the entire channel region but only portions of the source/drain regions. Advantageously, the buried oxide layer can provide a diffusion barrier and/or electrical isolation barrier for the channel region while permitting deeply implanted portions of the source and drain outside the buried oxide layer to better accommodate a salicidation process.

Figure 1A:
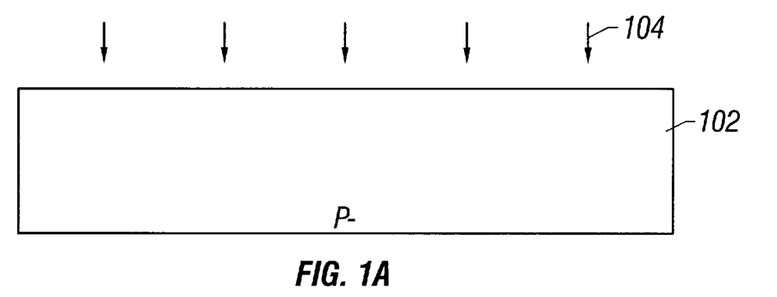
FIGS. 1A–1K show cross-sectional views of successive process steps for forming an IGFET with a buried oxide layer in accordance with a first embodiment of the invention.

In FIG. 1A, semiconductor substrate 102 suitable for integrated circuit manufacture is provided. Substrate includes a P-type epitaxial surface with a planar top surface, <100> orientation, a boron doping concentration of $1\times10^{15}$ atoms/cm$^3$ and a resistivity of 12 ohm-cm. For convenience of illustration, a single active region in the epitaxial surface layer is shown. The epitaxial surface layer is disposed on a P+ base layer (not shown).

Substrate 102 receives a well implant, a punchthrough implant, and a threshold adjust implant, collectively shown as arrows 104. The well implant provides a more uniform background doping, the punchthrough implant provides the channel region with greater robustness to punchthrough voltages, and the threshold adjust implant sets the threshold voltage of the IGFET to about 0.5 to 0.7 volts. The well implant is provided by boron at a dose in the range of $1\times10^{12}$ to $1\times10^{13}$ atoms/cm$^2$ and an energy in the range of 100 to 170 kiloelectron-volts, the punchthrough implant is provided by boron at a dose in the range of $1\times10^{12}$ to $1\times10^{13}$ atoms/cm$^2$ and an energy in the range of 40 to 100 kiloelectron-volts, and the threshold adjust implant is provided by boron at a dose in the range of $1\times10^{12}$ to $1\times10^{13}$ atoms/cm$^2$ and an energy in the range of 2 to 30 kiloelectron-volts. The well implant provides the active region with a P-type background doping concentration of about $1\times10^{16}$ atoms/cm$^3$, and the threshold adjust implant provides a P-type surface doping concentration of about $1\times10^{17}$ atoms/cm$^3$. Thereafter, field oxides (not shown) are formed using standard LOCOS oxidation to provide sidewall isolation between the active region (shown) and adjacent active regions (not shown) in substrate 102.

Figure 1B:
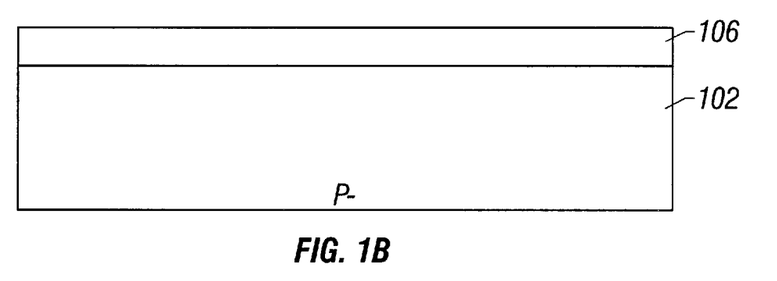

In FIG. 1B, oxide layer 106 composed of silicon dioxide (SiO$_2$) with a thickness of 3000 to 8000 angstroms is conformally deposited on substrate 102 by plasma enhanced chemical vapor deposition at a temperature in the range of 300 to 450° C.

Figure 1C:
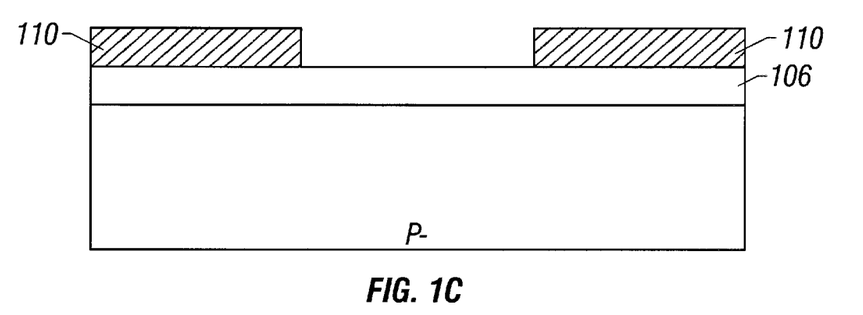

In FIG. 1C, photoresist layer 110 is deposited on oxide layer 106. A photolithographic system, such as a step and repeat optical projection system which generates deep ultraviolet light from a mercury-vapor lamp, uses a first reticle to irradiate photoresist layer 110 with a first image pattern, the irradiated portions are removed, and photoresist layer 110 includes an opening that selectively exposes a portion of oxide layer 106.

Figure 1D:
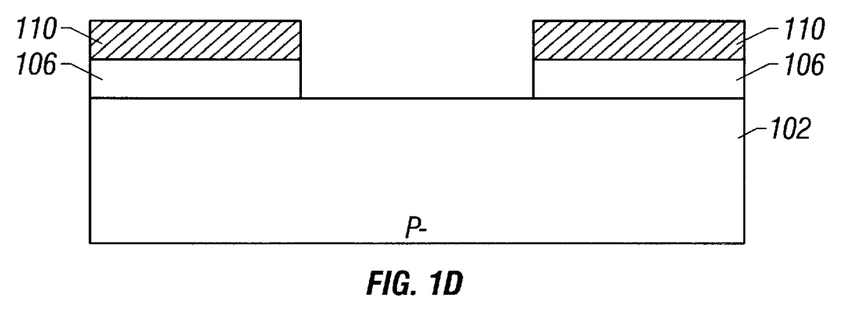

In FIG. 1D, an anisotropic dry etch is applied using photoresist layer 110 as an etch mask. Photoresist layer 110 protects the underlying regions of oxide layer 106, and the etch removes the exposed region of oxide layer 106 beneath the opening in photoresist layer 110. The etch is highly selective of silicon dioxide with respect to silicon so only a negligible amount of substrate 102 is removed. The etch forms an opening in oxide layer 106 that exposes a portion of substrate 102.

Figure 1E:
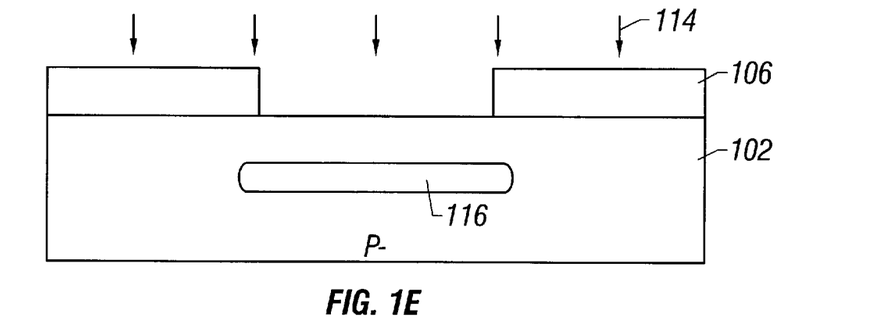

In FIG. 1E, photoresist layer 110 is stripped, and then the structure is subjected to ion implantation of oxygen, indicated by arrows 114, at a dosage in the range of $1\times10^{19}$ to $1\times10^{21}$ atoms/cm$^2$ and an energy in the range of 12 to 60 kiloelectron-volts, using oxide layer 106 as an implant mask. The oxygen ions are implanted through the opening in oxide layer 106 into substrate 102 while substrate 102 is heated to a temperature in the range of 600 to 700° C.

Thereafter, a high-temperature anneal is performed at a temperature in the range of 950 to 1050° C. for 45 minutes in a nitrogen (N$_2$) ambient to react the implanted oxygen with silicon in substrate 102 to form buried oxide layer 116 in substrate 102. Thereafter, if desired, a low temperature anneal on the order of 600 to 900° C. for 30 to 60 minutes can be applied to perform solid phase epitaxial growth of substrate 102 to reduce implant damage.

Buried oxide layer 116 is a continuous layer of stoichiometric silicon dioxide with a length (between the lateral ends) of about 4500 angstroms and a height (between the apex and trough) of 600 to 1200 angstroms. The top surface of buried oxide layer 116 (at the apex) is about 200 to 800 angstroms beneath the top surface of substrate 102, and the bottom surface of buried oxide layer 116 (at the trough) is about 800 to 2000 angstroms beneath the top surface of substrate 102. Furthermore, buried oxide layer 116 has a somewhat oval-shaped cross-section due to the vertical and lateral straggle of the implanted oxygen.

The oxygen is implanted with a significantly lower dosage and energy than typical SIMOX processing so that buried oxide layer 116 is significantly thinner and significantly closer to the top surface of the substrate than a typical SIMOX oxide layer. The lower dosage and energy also facilitate crystalline recovery since the oxygen implant amorphizes the surface of the substrate. Moreover, by using oxide layer 106 as an implant mask, the localized oxygen implantation amorphizes only the exposed region of substrate 102, thereby further reducing implant damage in comparison to conventional SIMOX techniques.

Figure 1F:
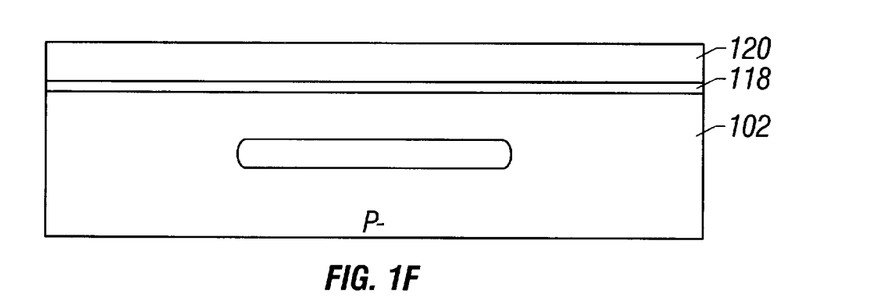

In FIG. 1F, oxide layer 106 is stripped, and then a blanket layer of gate oxide 118 is thermally grown on the exposed portions of the top surface of substrate 102 using tube growth at a temperature in the range of 700 to 1000° C. in an $O_2$ containing ambient. Gate oxide 118 has a thickness in the range of 30 to 100 angstroms. Thereafter, a blanket layer of undoped polysilicon layer 120 is deposited by low pressure chemical vapor deposition on the top surface of the gate oxide 118. Polysilicon layer 120 has a thickness of 2000 angstroms. Although polysilicon layer 120 can doped in situ or by ion implantation immediately after deposition occurs, it is preferable to defer doping polysilicon layer 120 until a subsequent source/drain implant step.

Figure 1G:
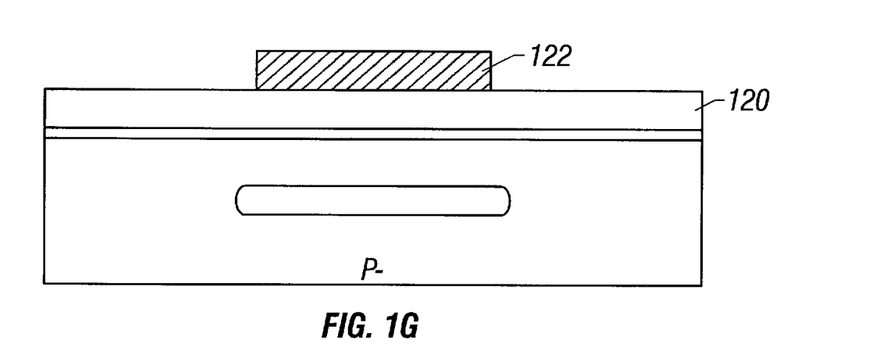

In FIG. 1G, photoresist layer 122 is deposited on polysilicon layer 120. The photolithographic system uses a second reticle to irradiate photoresist layer 122 with a second image pattern. Thereafter, the irradiated portions of photoresist layer 122 are removed, and photoresist layer 122 includes openings above selected portions of polysilicon layer 120.

Figure 1H:
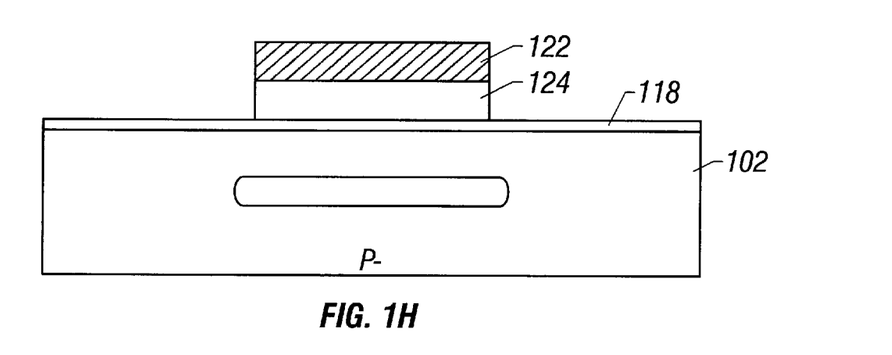

In FIG. 1H, an anisotropic dry etch is applied using photoresist layer 122 as an etch mask. Photoresist layer 122 protects the underlying regions of polysilicon layer 120, and the etch removes the exposed regions of polysilicon layer 120 beneath the openings in photoresist layer 122. The etch is highly selective of polysilicon with respect to silicon dioxide, so only a negligible amount of gate oxide 118 is removed and substrate 102 is unaffected. The etch forms gate electrode 124 from the unetched portion of polysilicon layer 120 over the active region. Gate electrode 124 has opposing vertical sidewalls separated by a length of 3500 angstroms, and a thickness (or height above the underlying gate oxide 118) of 2000 angstroms.

Figure 1I:
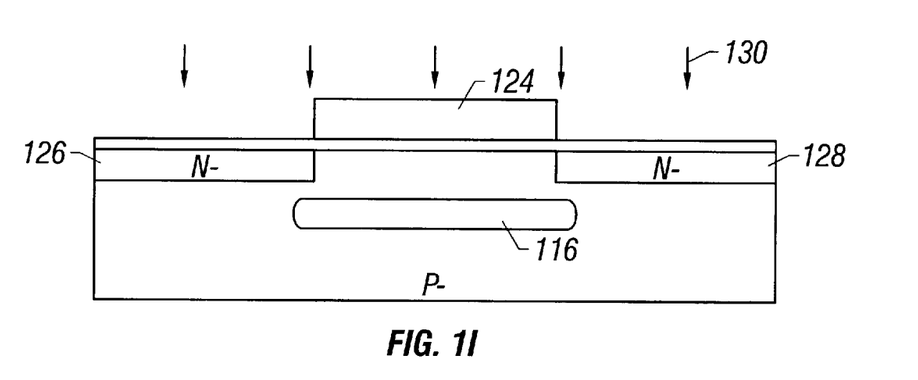

In FIG. 1I, photoresist layer 122 is stripped, and then lightly doped source and drain regions 126 and 128 are implanted into the active region by subjecting the structure to ion implantation of phosphorus, indicated by arrows 130, at a dose in the range of $1 \times 10^3$ to $5 \times 10^{14}$ atoms/cm$^2$ and an energy of 10 to 25 kiloelectron-volts, using gate electrode 124 as an implant mask. Lightly doped source/drain regions 126 and 128 are self-aligned to the opposing sidewalls of gate electrode 124 and are doped N− with a phosphorus concentration of about $1 \times 10^{17}$ to $1 \times 10^{18}$ atoms/cm$^3$. Lightly doped source/drain regions 126 and 128 include channel junctions that define the length of a channel region therebetween. Furthermore, the bottom surfaces of lightly doped source/drain regions 126 and 128 are above the top surface of buried oxide layer 116.

Figure 1J:
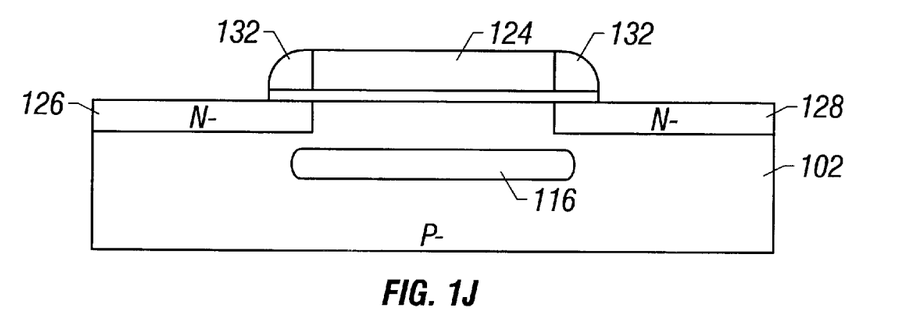

In FIG. 1J, an oxide layer with a thickness of 1500 angstroms is conformally deposited over the exposed surfaces by plasma enhanced chemical vapor deposition at a temperature in the range of 300 to 450° C. Thereafter, the structure is subjected to an anisotropic reactive ion etch that forms oxide spacers 132 adjacent to the opposing sidewalls of gate electrode 124. Spacers 132 each laterally extend about 1000 angstroms across substrate 102. Spacers 132 cover portions of lightly doped source/drain regions 126 and 128 and laterally extend beyond the lateral ends of buried oxide layer 116.

Figure 1K:
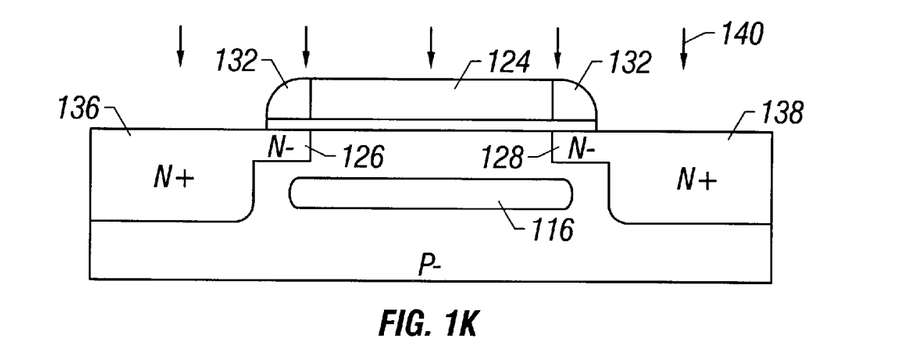

In FIG. 1K, heavily doped source and drain regions 136 and 138 are implanted into the active region by subjecting the structure to ion implantation of arsenic, indicated by arrows 140, at a dose in the range of $1 \times 10^{15}$ to $5 \times 10^{15}$ atoms/cm$^2$ and an energy of 10 to 80 kiloelectron-volts, using gate electrode 124 and spacers 132 as an implant mask. Heavily doped source/drain regions 136 and 138 are self-aligned to the outside edges of spacers 132 and are doped N+ with an arsenic concentration in the range of about $1 \times 10^{18}$ to $1 \times 10^{20}$ atoms/cm$^3$. Heavily doped source/drain regions 136 and 138 are spaced from the channel junctions, and have a substantially greater depth than lightly doped source/drain regions 126 and 128. Furthermore, the bottom surfaces of heavily doped source/drain regions 136 and 138 are below the bottom surface of buried oxide layer 116.

Thereafter, the device is annealed to remove crystalline damage and to drive-in and activate the implanted dopants by applying a rapid thermal anneal on the order of 800 to 1100° C. for 10 to 30 seconds. As a result, an N-channel IGFET includes gate electrode 124, a source (consisting of source regions 126 and 136) and a drain (consisting of drain regions 128 and 138).

As is seen, buried oxide layer 116 extends the entire length of the channel region but does not contact the source and drain. The top surface of buried oxide layer 116 is closer than the bottom surfaces of heavily doped source/drain regions 136 and 138 to the top surface of substrate 102. The lateral ends of buried oxide layer 116 are beneath lightly doped source/drain regions 126 and 128, but do not extend beneath heavily doped source/drain regions 136 and 138. Thus, buried oxide layer 116 is a segment that does not extend across the entire length of the active region.

Furthermore, buried oxide layer 116 does not limit the depth of heavily doped source/drain regions 136 and 138. Various contact technologies such as salicidation require a minimum depth of the source and drain in order to prevent alloying the entire depth of the source and drain and shorting the contacts to the substrate. Advantageously, buried oxide layer 116 allows heavily doped source/drain regions 136 and 138 to have sufficient depth to accommodate a subsequent salicidation process.

FIGS. 2A–21H show cross-sectional views of successive process steps for forming an IGFET with a buried oxide layer in accordance with a second embodiment of the invention. The primary difference between the second embodiment and the first embodiment is that in the second embodiment, the oxygen is implanted after the gate electrode is formed. Accordingly, the oxygen is implanted both through the gate electrode and outside the gate electrode, resulting in a buried oxide layer that is shallower under the gate electrode than outside the gate electrode. Therefore, the buried oxide layer is shallower under the channel region than it is under the source and drain. Another key difference between the second embodiment and the first embodiment is that in the second embodiment, the buried oxide layer extends beneath the entire source and drain, contacts the bottom surfaces of the source and drain, and limits the depth of the source and drain. Unless otherwise noted, the elements for the second embodiment (e.g., substrate 202, gate oxide 218, etc.) are similar to elements of the first embodiment (e.g., substrate 102, gate oxide 118, etc.), and the description of related elements and process steps need not be repeated.

Figure 2A:
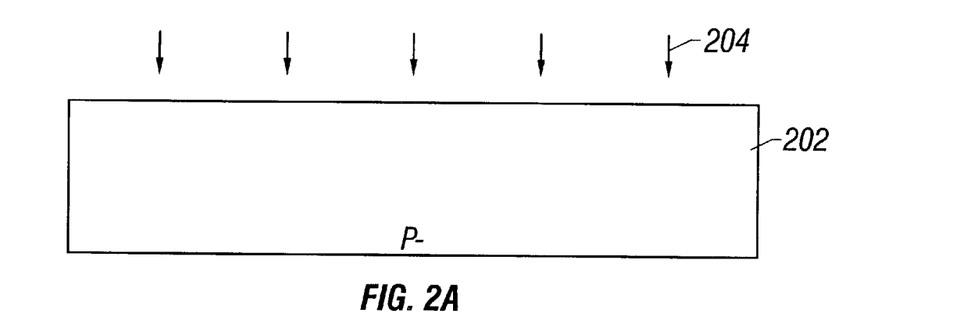
FIGS. 2A–2H show cross-sectional views of successive process steps for forming an IGFET with a buried oxide layer in accordance with a second embodiment of the invention.

In FIG. 2A substrate 202 is provided. A well implant, punchthrough implant, and threshold adjust implant, collectively shown as arrows 204, are applied to substrate 202. In addition, field oxides (not shown) are formed to provide sidewall isolation between the active region (shown) and adjacent active regions (not shown) in substrate 202.

Figure 2B:
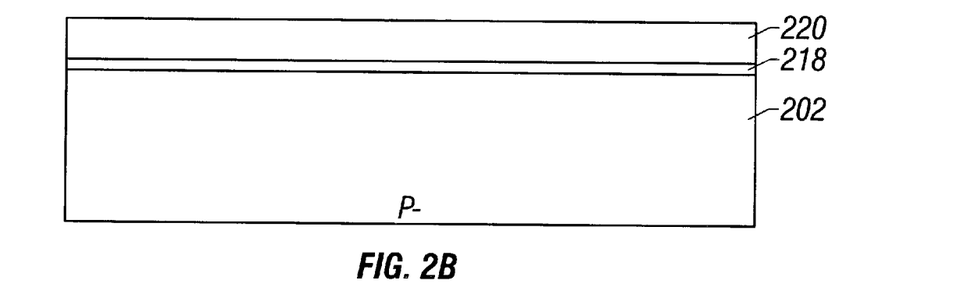

In FIG. 2B, gate oxide 218 is formed on substrate 202, and polysilicon layer 220 is formed on gate oxide 218. However, the buried oxide layer has yet to be formed.

Figure 2C:
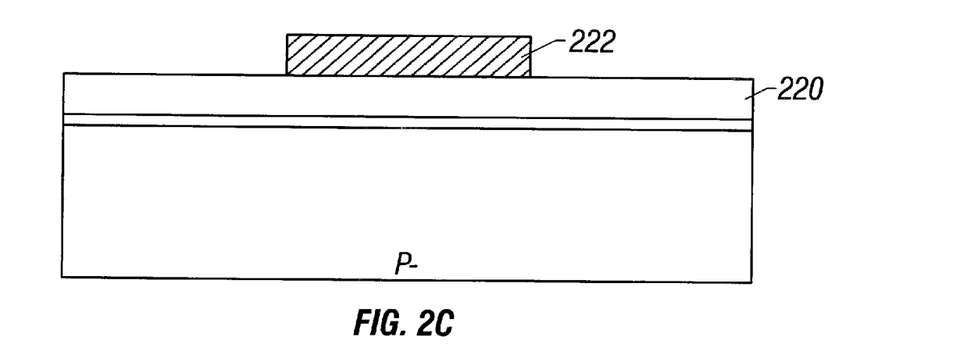

In FIG. 2C, photoresist layer 222 is deposited on polysilicon layer 220 and patterned to include openings above selected portions of polysilicon layer 220.

Figure 2D:
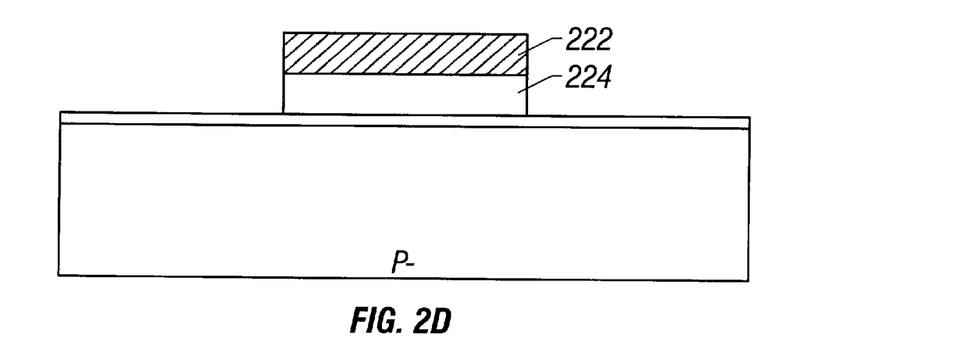

In FIG. 2D, an anisotropic dry etch is applied using photoresist layer 222 as an etch mask to form gate electrode 224 from the unetched portion of polysilicon layer 220.

Figure 2E:
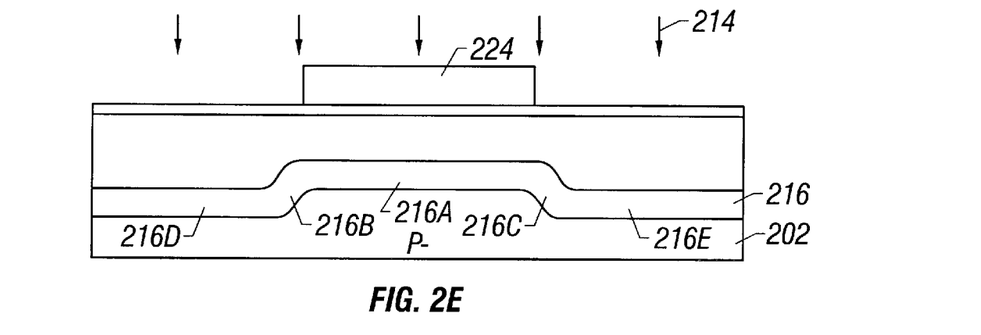

In FIG. 2E, photoresist layer 222 is stripped, and the structure is subjected to ion implantation of oxygen, indicated by arrows 214, at a dosage in the range of $1 \times 10^{19}$ to $1 \times 10^{21}$ atoms/cm$^2$ and an energy in the range of 50 to 120 kiloelectron-volts, while substrate 202 is heated. The oxygen implant has sufficient energy to transfer through gate electrode 224 into substrate 202. However, gate electrode 224 absorbs a significant amount of the implant energy. As a result, the implanted oxygen under gate electrode 224 is shallower than the implanted oxygen outside gate electrode 224. In addition, the field oxides (not shown) provide an implant mask for the implanted oxygen. If desired, an implant mask could be used to prevent the implanted oxygen from extending across the entire active region. After the oxygen is implanted, the high-temperature anneal is performed in a nitrogen ambient to react the implanted oxygen with silicon in substrate 202 to form buried oxide layer 216 as a continuous layer of stoichiometric silicon dioxide that extends between the field oxides. Buried oxide layer 216 includes central portion 216A, diagonal portions 216B and 216C, and outer portions 216D and 216E.

Central portion 216A is adjacent to diagonal portions 216B and 216C and the intersections are substantially aligned with the opposing sidewalls of gate electrode 224. The top surface of central portion 216A is about 200 to 500 angstroms beneath the top surface of substrate 202, and the bottom surface of central portion 216A is about 500 to 1000 angstroms beneath the top surface of substrate 202. The top surfaces of outer portions 216D and 216E are about 2200 to 2500 angstroms beneath the top surface of substrate 202. Outer portions 216D and 216E laterally extend to the field oxides (not shown) adjacent to the active region.

Figure 2F:
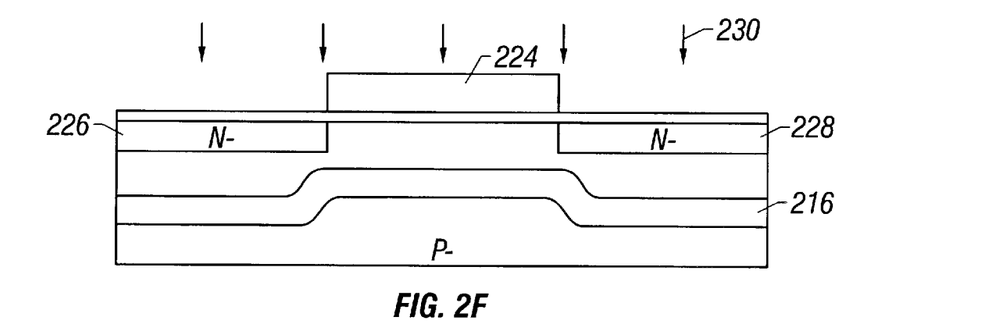

In FIG. 2F, lightly doped source and drain regions 226 and 228 are implanted into the active region by subjecting the structure to ion implantation of phosphorus, indicated by arrows 230, using gate electrode 224 as an implant mask. Lightly doped source/drain regions 226 and 228 are doped N− and include channel junctions that define the length of a channel region therebetween. Furthermore, the bottom surfaces of lightly doped source/drain regions 226 and 228 do not contact the underlying top surface of buried oxide layer 216.

Figure 2G:
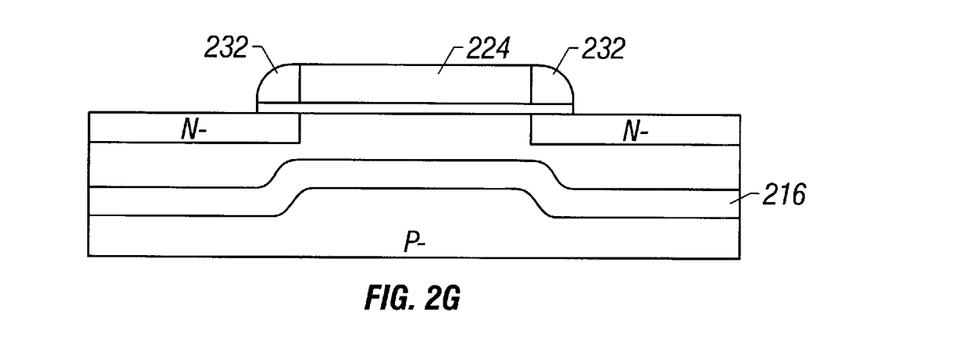

In FIG. 2G, an oxide layer is conformally deposited over the exposed surfaces, and then the structure is subjected to an anisotropic reactive ion etch that forms oxide spacers 232 adjacent to the opposing sidewalls of gate electrode 224. Buried oxide layer 216 extends beyond spacers 232.

Figure 2H:
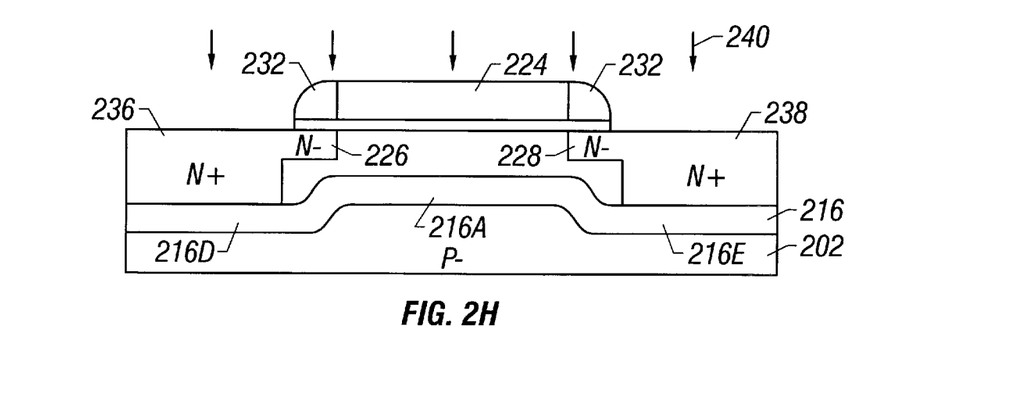

In FIG. 2H, heavily doped source and drain regions 236 and 238 are implanted into the active region by subjecting the structure to ion implantation of arsenic, indicated by arrows 240, using gate electrode 224 and spacers 232 as an implant mask. Heavily doped source/drain regions 236 and 238 are doped N+ and are spaced from the channel junctions and have a substantially greater depth than lightly doped source/drain regions 226 and 228. Furthermore, the bottom surfaces of heavily doped source/drain regions 236 and 238 contact the underlying top surface of buried oxide layer 216.

Thereafter, the device is annealed to remove crystalline damage and to drive-in and activate the implanted dopants by applying a rapid thermal anneal on the order of 950 to 1050° C. for 10 to 30 seconds. As a result, an N-channel IGFET includes gate electrode 224, a source (consisting of source regions 226 and 236) and a drain (consisting of drain regions 228 and 238).

As is seen, buried oxide layer 216 extends the entire length of the channel region and contacts heavily doped source/drain regions 236 and 238 without contacting lightly doped source/drain regions 226 and 228. The top surface of buried oxide layer 216 beneath the channel region is closer than the bottom surfaces of heavily doped source/drain regions 236 and 238 to the top surface of substrate 202. Furthermore, buried oxide layer 216 is a segment that extends across the entire length of the active region to the adjacent field oxides.

Although outer portions 216D and 216E of buried oxide layer 216 limit the depth of heavily doped source/drain regions 236 and 238, it is noted that outer portions 216D and 216E have a far greater depth than central portion 216A of buried oxide layer 216 beneath the channel region. In this manner, buried oxide layer 216 allows heavily doped source/drain regions 236 and 238 to have sufficient depth to accommodate a subsequent salicidation process. Furthermore, even if the subsequent salicidation process forms salicide contacts that extend through the entire depth of heavily doped source/drain regions 236 and 238, outer portions 216D and 216E of buried oxide layer 216 prevents such contacts from shorting to substrate 202.

Buried oxide layer 216, as compared to buried oxide layer 116, provides a diffusion barrier for the entire source and drain, although the choice of contact technologies may be more limited.

Further processing steps in the fabrication of IGFETs typically include forming salicide contacts on the gate electrode, source and drain, forming a thick oxide layer over the active regions, forming contact windows in the oxide layer above the salicide contacts, depositing interconnect metallization in the contact windows, and forming a passivation layer over the interconnect metallization. In addition, earlier or subsequent high-temperature process steps can be used to supplement or replace the drive-in step to provide the desired anneal, activation, and drive-in functions. These further processing steps are conventional. Likewise the principal processing steps disclosed herein may be combined with other steps apparent to those skilled in the art.

Increasing the closeness of the top surface of the buried oxide layer beneath the channel region to the top surface of the substrate above the channel region provides significant advantages. First, since the buried oxide layer provides a diffusion barrier or stop-layer beneath the channel region, the dopants in the channel region (such as the threshold-adjust implant and the punchthrough implant) are better confined near the top surface of the substrate. Likewise, if a retrograde well is employed, the buried oxide layer prevents more of the retrograde well dopants from diffusing into the channel region.

As another advantage, the buried oxide layer provides better electrical isolation between the channel region and deep portions of the source and drain. The buried oxide layer can define the lower boundary of the channel region, thereby reducing the effective depth of the channel region. Likewise, the buried oxide layer provides an electrical isolation barrier beneath the channel region so that channel currents are better confined near the top surface of the substrate. This allows for increasing the inversion layer density and therefore drive current of the IGFET for a given voltage, which becomes increasingly important as operation voltages are reduced. This also allows for subthreshold currents to roll off faster (i.e., allows the subthreshold drain-source current to decrease more predictably with decreasing gate voltage). Deep channel currents between deep portions of the source and drain tend to be essentially independent of gate voltage, and therefore are undesirable. Positioning the top surface of the buried oxide layer closer to the top surface of the substrate tends to reduce deep channel currents.

As a further advantage, when an inversion layer forms in the channel region, a depletion region forms beneath the inversion layer. The depletion region leads to depletion capacitance, which is proportional to the dielectric coefficient in the depletion region. The dielectric coefficient of silicon dioxide ($3.9\epsilon_0$) is approximately one-third that of silicon ($11.7\epsilon_0$). Therefore, positioning the top surface of the buried oxide layer closer to the top surface of the substrate tends to dispose more of the buried oxide layer in the dielectric region associated with the depletion capacitance, thereby reducing the depletion capacitance and increasing switching speeds of the IGFET.

It should be noted the primary advantages of the buried oxide layer will be lost if the buried oxide layer is non-continuous to a significant extent. In fact, the stress caused by silicon nodules can enhance diffusion into the area of the nodules, allow electrical currents to flow deeply into the substrate, and allow the depletion layer to extend deeply into the substrate. In addition, such nodules act as minority carrier generation/recombination centers which reduce minority carrier lifetimes and increase leakage in the channel region.

Although the previous embodiments have been described in terms of implanted oxygen, it is understood that other insulative materials can be implanted and reacted with silicon to form the buried insulative layer. For example, U.S. Pat. No. 5,436,175 reports fabricating buried insulative layers using SIMNI (Separation by IMplanted NItrogen) and SIMON (Separation by IMplanted Oxygen and Nitrogen). With SAIM, implanting atomic nitrogen ions in a silicon substrate generally requires approximately the same implant energy and implant dose as is used to implant atomic oxygen ions in the SIMOX process. Following nitrogen implantation, the substrate is annealed in accordance with the SIMOX process to form a buried insulative layer of silicon nitride ($Si_3N_4$). Similarly, SIMON implants a combination of oxygen ions and nitrogen ions in a silicon substrate to form a buried insulative layer of silicon oxynitride ($Si_xN_yO_z$). U.S. Pat. No. 5,436,175 also reports implanting both atomic ions and molecular ions of oxygen, nitrogen, and combinations thereof U.S. Pat. No. 5,436,175 is incorporated herein by reference.

The present invention includes numerous variations to the embodiments described above. For instance, the gate electrode can be a conductive metal such as cobalt or titanium, and the gate insulator and spacers can be various dielectrics. The field oxides can be replaced by isolation trenches subsequently filled with isolation oxide. Various implant masks such as thermally grown oxide beneath a nitride cap can be used. The well implant, punchthrough implant, and/or threshold adjust implant may not be necessary. The source and drain can be formed in various ways. For instance, the source and drain can be doped using a single implant step without the spacers. In addition, the source/drain implants can be preceded by punchthrough (or pocket) implants of the same conductivity type as the substrate. The invention is well-suited for CMOS processes, and the conductivity types of the dopants can be reversed. Suitable N-type dopants include arsenic and phosphorus; suitable P-type dopants include boron $B_{10}$, boron $B_{11}$, and $BF_X$ species such as $BF_2$. Various embodiments of the invention need not necessarily provide all the advantages listed above.

The invention is particularly well-suited for fabricating N-channel MOSFETs, P-channel MOSFETs, and other types of IGFETs, particularly for high-performance microprocessors where high circuit density is essential. Although only a single IGFET has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory, and a system bus.

Those skilled in the art will readily implement the steps necessary to provide the structures and methods disclosed herein, and will understand that the process parameters, materials, dimensions, and sequence of steps are given by way of example only and can be varied to achieve the desired structure as well as modifications which are within the scope of the invention. Variations and modifications of the embodiments disclosed herein may be made based on the description set forth herein, without departing from the spirit and scope of the invention as set forth in the following claims.

What is claimed is:

1. A method of forming an IGFET, comprising the steps of:

implanting selected ions into a semiconductor substrate;

reacting the selected ions with the substrate to form a buried insulative layer in the substrate;

forming a gate insulator on a top surface of the substrate;

forming a gate electrode on the gate insulator;

forming a lightly doped source region and a lightly doped drain region in the substrate such that a channel region therebetween is adjacent to the gate insulator; wherein a top surface of the buried insulative layer is beneath the channel region and is closer to the top surface of the substrate than bottom surfaces of the source and drain, wherein the lightly doped source and drain regions are not in contact with the buried insulative level; and forming a heavily doped source region and a heavily doped drain region in the substrate.

2. The method of claim 1, wherein the insulative material is implanted before the gate electrode is formed and before the source and drain are formed.

3. The method of claim 2, wherein the insulative material is implanted through an opening in an implant mask so the buried insulative layer extends less than a length of an active region that includes the source, drain and channel region.

4. The method of claim 1, wherein the insulative material is implanted after the gate electrode is formed.

5. The method of claim 4, wherein the insulative material is implanted through the gate electrode and outside the gate electrode such that a central portion of the buried insulative layer beneath the gate electrode is closer to the top surface of the substrate than are outer portions of the buried insulative layer outside the gate electrode.

6. The method of claim 1, further including forming field oxides in the top surface of the substrate, and then implanting the insulative material using the field oxides alone as an implant mask.

7. The method of claim 1 further comprising forming sidewall spacers on side walls of the gate electrode.

8. The method of claim 7 wherein the lightly doped source and drain region are aligned with the gate electrode and the heavily doped source drain regions are aligned with the sidewall spacers.

9. The method of claim 8, wherein the the lightly doped source and drain regions are formed with a first ion dopant and the heavily doped source and drain regions are formed with a second ion dopant.

10. The method of claim 5 further comprising forming sidewall spacers on side walls of the gate electrode, wherein the lightly doped source and drain region are aligned with the gate electrode and the heavily doped source drain regions are aligned with the sidewall spacers.

11. A method of forming an IGFET, comprising:
providing a semiconductor substrate;
forming a masking layer over the substrate;
forming a first photoresist layer over the masking layer;
etching the masking layer using the first photoresist layer as an etch mask to form an implant mask from an unetched portion of the masking layer;
removing the first photoresist layer;
implanting oxygen through an opening in the implant mask into the substrate;
performing a high-temperature anneal so that the implanted oxygen reacts with silicon in the substrate to form a buried oxide layer of stoichiometric silicon dioxide in the substrate;
removing the implant mask;
forming a gate oxide on a top surface of the substrate;
depositing a polysilicon layer on the gate oxide;
forming a second photoresist layer over the polysilicon layer;
etching the polysilicon layer using a second photoresist layer as an etch mask to form a gate electrode from an unetched portion of the polysilicon layer;
removing the second photoresist layer; and
forming a source and a drain in the substrate, wherein forming a source includes forming a lightly doped source region with a first ion dopant and forming a heavily doped source region with a second ion dopant and forming a drain includes forming lightly doped and heavily doped drain regions, such that the buried oxide layer extends beneath the lightly doped source and drain regions and the buried oxide layer does not extend beneath the heavily doped source and drain regions, wherein a channel region is between and adjacent to the source and drain, and wherein a top surface of the buried oxide layer beneath the channel region is closer to the top surface of the substrate than are bottom surfaces of the heavily doped source regions and heavily doped drain regions.

12. The method of claim 11, wherein the lightly doped drain and lightly doped source regions are aligned with the gate electrode, and wherein the method farther comprises the step of forming sidewall spacers on sidewalls of the gate electrode, the heavily doped source and the heavily doped drain regions being aligned with the sidewall spacers.

13. The method of claim 12, wherein the buried oxide layer does not contact the lightly doped source region and the lightly doped drain region.

14. The method of claim 13, wherein the buried oxide layer provides a diffusion barrier and an electrical isolation barrier for the channel region.

15. The method of claim 11, wherein the steps are performed in the sequence set forth.

16. A method of forming an IGFET, comprising:
providing a semiconductor substrate;
forming a gate oxide on a top surface of the substrate;
forming a polysilicon layer on the gate oxide;
forming a photoresist layer over the polysilicon layer;
etching the polysilicon layer using the photoresist layer as an etch mask to form a gate electrode from an unetched portion of the polysilicon layer;
removing the photoresist layer;
implanting oxygen through the gate electrode into the substrate and outside the gate electrode into the substrate;
performing a high-temperature anneal so that the implanted oxygen reacts with silicon in the substrate to form a buried oxide layer of stoichiometric silicon dioxide in the substrate, wherein the buried oxide layer includes a central portion beneath the gate electrode and outer portions outside the gate electrode, and the central portion is closer than the outer portions to the top surface of the substrate; and
forming a source and a drain in the substrate, forming a source including forming lightly doped and heavily doped source regions, and forming a drain including forming lightly doped and heavily doped drain regions, such that the buried oxide layer extends beneath the lightly doped and heavily doped source and drain regions, the buried oxide layer contacting the heavily doped source and drain regions and not contacting the lightly doped source and drain regions, wherein a channel region is between and adjacent to the lightly doped source and the lightly doped drain, and wherein a top surface of the buried oxide layer beneath the channel region is closer to the top surface of the substrate than are bottom surfaces of the source and drain.

17. The method of claim 16, wherein the lightly doped and drain regions are aligned with the gate electrode.

18. The method of claim 17 further including the step of forming sidewalls spacers on the sidewalls of the gate electrode, wherein the heavily doped source and drain regions are aligned with the sidewall spacers.

19. The method of claim 18, wherein the buried oxide layer provides a diffusion barrier and an electrical isolation barrier for the channel region.

20. The method of claim 16, wherein the steps are performed in the sequence set forth.

* * * * *